US012813323B2

(12) United States Patent
Wang et al.

(10) Patent No.: US 12,813,323 B2
(45) Date of Patent: Nov. 24, 2026

(54) PLASMA DICING FOR SEMICONDUCTOR DEVICE FABRICATION

(71) Applicant: Micron Technology, Inc., Boise, ID (US)

(72) Inventors: Yichen Wang, Taichung (TW); Tsung Che Tsai, Tainan City (TW); Vibhav Gupta, Singapore (SG); Wei Chang Wong, Singapore (SG); Raj K. Bansal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 419 days.

(21) Appl. No.: 18/605,161

(22) Filed: Mar. 14, 2024

(65) Prior Publication Data

US 2024/0371824 A1 Nov. 7, 2024

Related U.S. Application Data

(60) Provisional application No. 63/463,645, filed on May 3, 2023.

(51) Int. Cl.
*H01L 23/00* (2006.01)
*H10P 50/24* (2026.01)
(Continued)

(52) U.S. Cl.
CPC ......... *H10W 74/114* (2026.01); *H10P 50/242* (2026.01); *H10W 46/00* (2026.01);
(Continued)

(58) Field of Classification Search
CPC ... H10W 74/114; H10W 70/65; H10W 74/47; H10W 46/00; H10W 46/503; H10W 72/0198; H10P 50/242; H10B 80/00
See application file for complete search history.

(56) References Cited

U.S. PATENT DOCUMENTS

2013/0344683 A1 12/2013 Lazerand et al.
2017/0256638 A1 9/2017 Macelwee et al.
(Continued)

FOREIGN PATENT DOCUMENTS

TW 202217980 A 5/2022

OTHER PUBLICATIONS

TW Patent Application No. 113116388—Taiwanese Office Action and Search Report, dated Feb. 17, 2025, with English Translation, 22 pages.

(Continued)

*Primary Examiner* — Victor A Mandala
*Assistant Examiner* — Colleen E Snow
(74) *Attorney, Agent, or Firm* — Dorsey & Whitney LLP

(57) ABSTRACT

A semiconductor device including a semiconductor die and an encapsulant material disposed at the edges of the semiconductor die and among the plurality of fin shape structures. The semiconductor die further includes a substrate, a functional die region disposed in a center of the semiconductor die, the functional die region having a stack layer structure within which a plurality of dielectric layers and a plurality of electrically conductive layers alternatively stacked, and a die edge region disposed at edges of the semiconductor die, the die edge region including a plurality of fin shape structures protruding along a horizontal direction to a sidewall of the semiconductor device.

20 Claims, 10 Drawing Sheets

(51) Int. Cl.

| | |
|---|---|
| ***H10W 46/00*** | (2026.01) |
| ***H10W 70/65*** | (2026.01) |
| ***H10W 74/10*** | (2026.01) |
| ***H10W 74/47*** | (2026.01) |
| *H10B 80/00* | (2023.01) |
| *H10W 72/00* | (2026.01) |

(52) U.S. Cl.

CPC ........... *H10W 70/65* (2026.01); *H10W 74/47* (2026.01); *H10B 80/00* (2023.02); *H10W 46/503* (2026.01); *H10W 72/0198* (2026.01)

(56) References Cited

U.S. PATENT DOCUMENTS

| | | | |
|---|---|---|---|
| 2018/0158749 | A1 | 6/2018 | Yu et al. |
| 2021/0193524 | A1 | 6/2021 | Kamphuis et al. |
| 2022/0122893 | A1 | 4/2022 | Lai et al. |
| 2023/0023523 | A1 | 1/2023 | Minamitani et al. |
| 2023/0068435 | A1 | 3/2023 | Kao et al. |
| 2025/0070052 | A1* | 2/2025 | Wen ...................... H10W 42/00 |
| 2025/0273561 | A1* | 8/2025 | Maekura ............ G11C 16/0483 |

OTHER PUBLICATIONS

International Application No. PCT/US2024/026034—International Search Report and Written Opinion, mailed Aug. 13, 2024, 9 pages.

* cited by examiner

PLASMA DICING FOR SEMICONDUCTOR DEVICE FABRICATION

CROSS-REFERENCE TO RELATED APPLICATION(S)

The present application claims priority to U.S. Provisional Patent Application No. 63/463,645, filed May 3, 2023, the disclosure of which is incorporated herein by reference in its entirety.

TECHNICAL FIELD

The present disclosure generally relates to semiconductor memory device fabrication, and more particularly relates to utilizing plasma dicing to cut semiconductor wafer into semiconductor dice.

BACKGROUND

Microelectronic devices generally have a die (i.e., a chip) that includes integrated circuitry with a high density of very small components. Typically, dice are fabricated by cutting a semiconductor wafer using wafer slicing technologies including scribing to make shallow grooves on a frontside surface of the wafer and then breaking the wafer into dices along the scribed lines using a mechanical or laser-induced process. After dice are formed, they are "packaged" to couple with a larger array of electrical terminals that can be more easily coupled to the various power supply lines, signal lines, and ground lines. Conventional processes for packaging dice include encapsulating the dice to protect them from environmental factors (e.g., moisture, particulates, static electricity, and physical impact).

Figure 1:
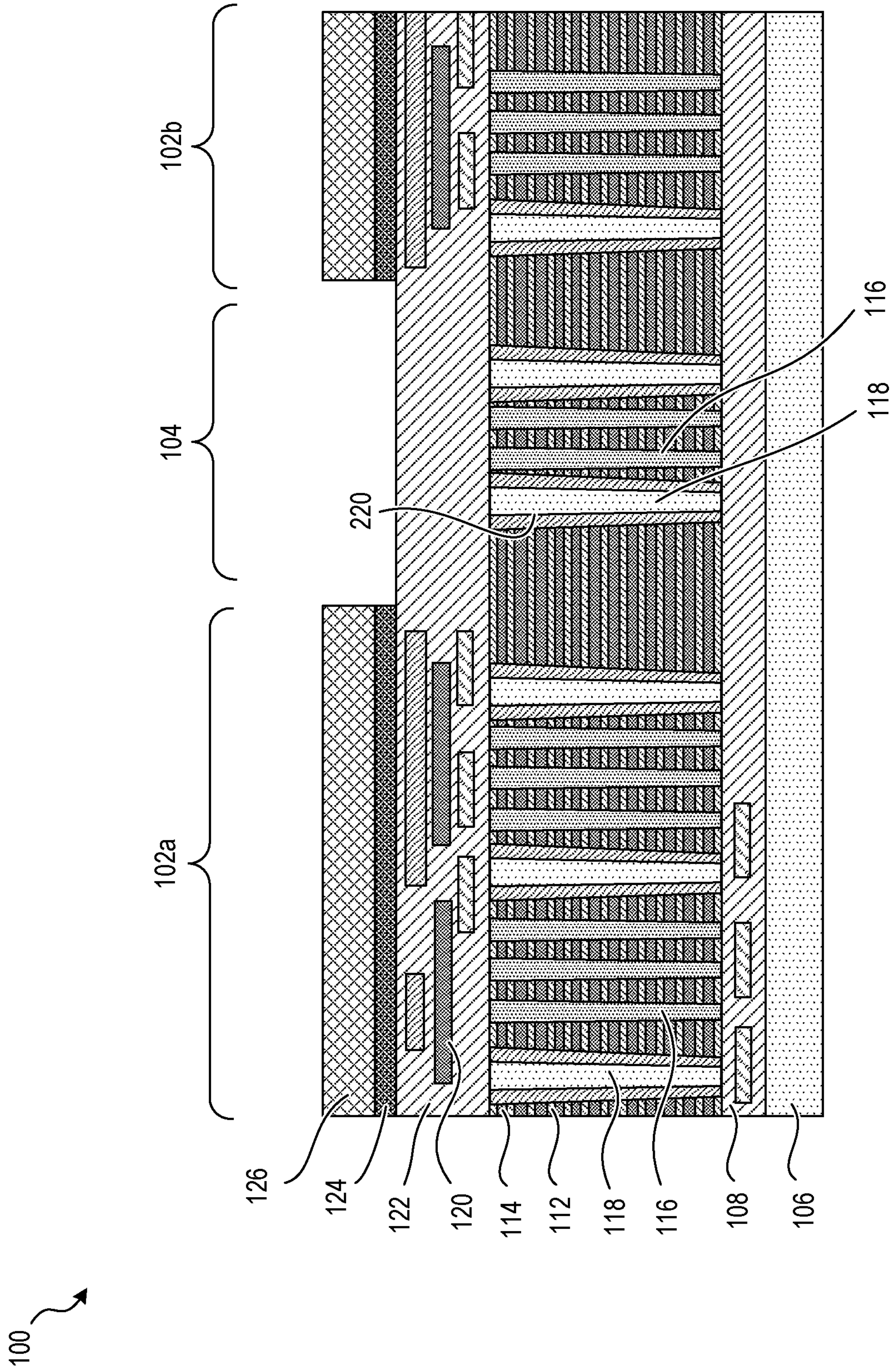
FIG. 1 depicts a schematic view of a semiconductor wafer incoming to a wafer dicing process.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

The processing of memory devices, such as non-volatile NAND and 3D DRAM (Dynamic Random Access Memory), involves wafer dicing processes to cut a large semiconductor memory wafer into smaller individual dice. For advanced fabrication of memory devices, plasma dicing has been broadly adopted to etch grooves along a cutting venue on the frontside surface of the semiconductor wafer. In a plasma dicing process, plasma beam can be generated by ionizing a reaction gas such as nitrogen or argon in a vacuum chamber and then the reaction gas is delivered to the semiconductor wafer surface for plasma etching. The plasma etching replaces the mechanical scribing process in traditional mechanical dicing processes and offers several advantages including lower chip cracking risk, capable of dicing chips having small feature sizes, and higher throughput.

Prior to the semiconductor wafer dicing process, the semiconductor wafer may be patterned to expose scribe regions for plasma dicing. Reaction gas can be delivered into the exposed scribe regions to remove materials and structures disposed on the frontside surface of the semiconductor wafer. Moreover, the reaction gas will reach and etch the frontside substrate of the semiconductor wafer, to form shallow grooves or scratches along the scribe regions. For example, FIG. 1 depicts a cross-sectional schematic view of a semiconductor wafer 100 incoming to a wafer dicing process. The semiconductor wafer 100 includes a plurality of 3D NAND die regions (e.g., 102*a* and 102*b*) and a plurality of scribe regions (e.g., 104). In particular, the scribe region 104 is disposed between adjacent functional die regions 102*a* and 102*b*, through which a plasma dicing process can etch and form shallow grooves on substrate 106.

In this example, the semiconductor wafer 100 may include a plurality of NAND memory arrays including a plurality of alternatively aligned dielectric layers 112 and conductive layers 114. As shown in FIG. 1, the dielectric layers 112 and conductive layers 114 can be formed above a frontside surface of the substrate 106 and isolated by an interfacial layer 108. The dielectric layers 112 can be made of dielectric materials such as silicon oxide. Moreover, the conductive layers 114 can be made of conductive metallic material such as tungsten. In this example, vertical pillars 116 and slit trenches 118 can be disposed within the alternatively aligned dielectric layers 112 and conductive layers 114, and across the surface of the semiconductor wafer including the functional die regions 102*a*, 102*b*, and scribe region 104. Here, the vertical pillars 116 can be made of dielectric materials such as silicon oxide or silicon nitride to provide mechanical support to the memory array included in semiconductor wafer 100. In addition, the slit trenches 118 may be made of electrically conductive materials (e.g., tungsten or silver), for interconnections such as a ground interconnection of circuits included in the semiconductor wafer 100. In this example, redistribution layers may be formed above the alternatively aligned dielectric layers 112 and conductive layers 114 to provide electrical interconnection between memory cells and control circuits or power circuits disposed on other regions of the semiconductor wafer 100. The redistribution layers 120 may be made of metal layers such as copper or silver and disposed within a dielectric layer 122 for isolation. Further, another dielectric layer 124 and a polyimide (PI) layer 126 can be sequentially deposited above the dielectric layer 122. The dielectric layer 124 may be a silicon nitride layer and the PI layer 126 can be a thin film of polyimide materials deposited by a variety of techniques such as spin coating, spraying, or chemical vapor deposition (CVD). The PI layer 126 can serve for electrical isolation and provide mechanical support to the semiconductor wafer 100 and semiconductor dice included therein.

To cut a semiconductor memory wafer into semiconductor dice by utilizing the plasma dicing process, the PI layer 126 and dielectric layer 124 can be patterned to expose the dielectric layer 122 of the scribe region 104. Reactive etching gases can be delivered along the vertical direction to etch the dielectric layer 122. Once the dielectric layer 122 is patterned (i.e., partially removed from the scribe region 104), the plasma dicing process continues to deliver etching gases to the alternative stacked dielectric layers 112 and conductive layers 114, which includes the slit trenches 118 and pillars 116. The etching rate of plasma dicing process can vary depending on the type of material being etched. In general, the etch rate of silicon using plasma dicing can range from several microns per second to tens of microns per second. In comparison, the etch rate of dielectric films using plasma dicing can be much lower, e.g., ranging from several nanometer per second to several microns per minute. Further, the etch rate of metal materials using plasma dicing can be even lower. In this example, the plasma dicing process need to etch the alternatively aligned dielectric layers 112 and conductive layers 114, as well as vertically aligned slit trenches 118 and pillars 116 that are disposed in the scribe region. Here, the etch rate of dielectric layers using plasma dicing can be extremely slow, causing a low throughput of semiconductor memory device fabrication.

To address the above-described low etch rate challenges in semiconductor dicing using plasma dicing process and others, the present technology includes a novel process and structure of semiconductor memory wafer, on which the plasma dicing process can be conducted to cut the semiconductor wafer into semiconductor dice with improved efficiency. In particular, the present technology divides a semiconductor memory wafer into functional die regions and scribe regions. The scribe regions include a stack of alternatively aligned two types of dielectric layers and a plurality of slit trenches vertically passing through the stack of dielectric layers. There are also grid wall trenches disposed at the boundaries of the functional die regions and the scribe regions. Prior to cutting the semiconductor wafer using the plasma dicing technique, the semiconductor wafer is patterned to expose the stack of dielectric layers and top surfaces of the slit trenches. After that, the trench materials can be removed to expose the stack of alternatively aligned two types of dielectric layers on sidewalls of the plurality of slit trenches. One of the two type of dielectric layers can be further removed from the scribe region using a selective etching process, leaving a plurality of fin shape structures that are made of the other types of dielectric layers and are connected to corresponding grid wall trenches. The plurality of fin shape structure have a similar thickness ranging from 5 nm to 50 nm and are parallelly aligned. After removing dielectric stack layers in the scribe regions, the plasma dicing process can be utilized to cut the substrate of the semiconductor wafer. Further, encapsulant materials can be applies, e.g., flow into voids among the plurality of fin shape structures and on the sidewalls of individual semiconductor dies to complete the packaging. The present technology can be adopted in fabrications of various types of memory devices including 2D NAND, 3D NAND, 3D DRAM, and others.

Figure 2:
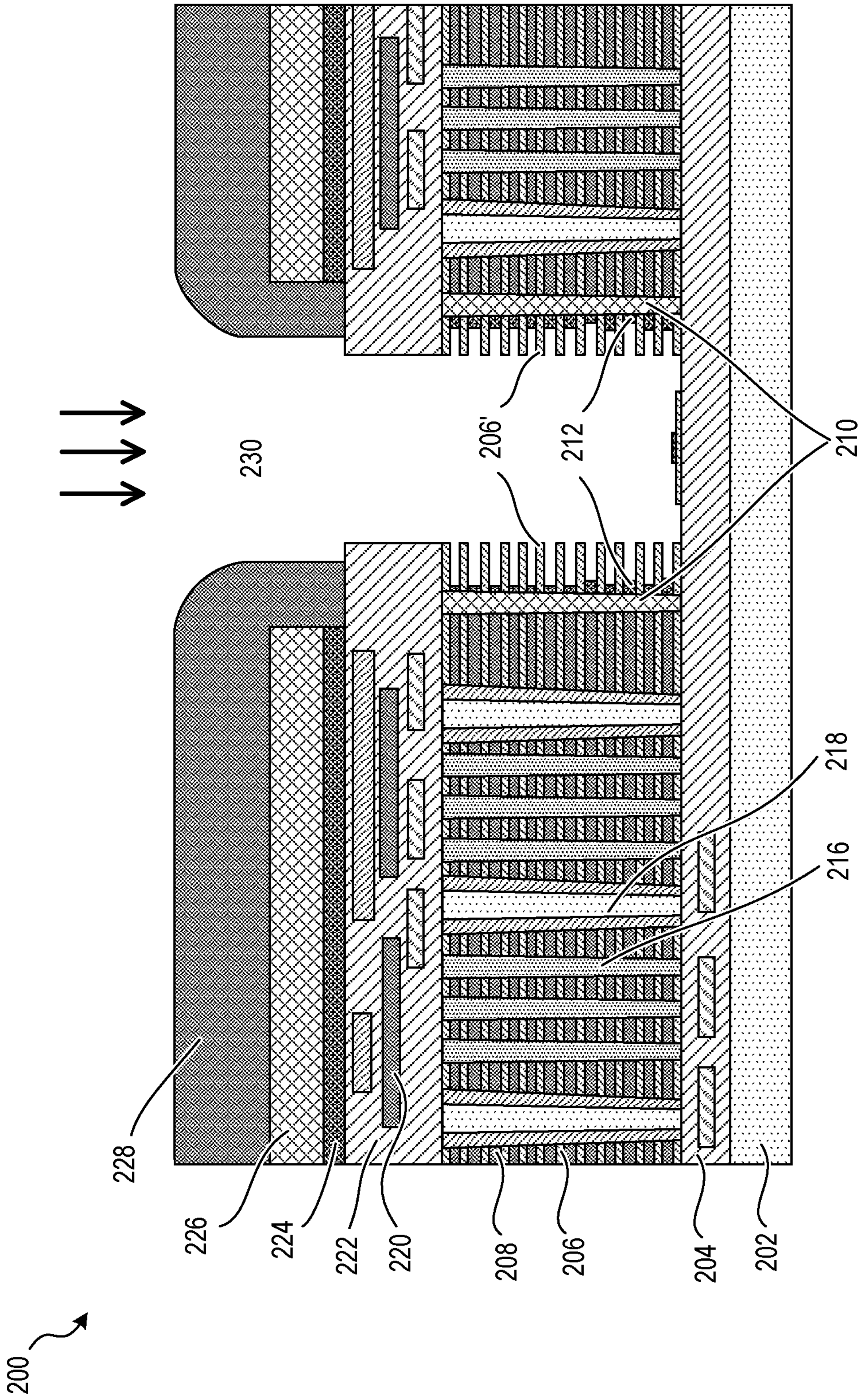
FIG. 2 depicts a schematic view of another semiconductor wafer incoming to a wafer dicing process to form semiconductor dies in accordance with embodiments of the present technology.

For example, FIG. 2 illustrates a cross-sectional schematic view of a semiconductor wafer 200 incoming to a plasma dicing process to form semiconductor dice in accordance with embodiments of the present technology. Specifically, the above described plasma dicing process can be conducted on the semiconductor wafer 200 to etch through the interfacial layer 204 and into the substrate 202 with a higher etch rate in comparison to that described in FIG. 1. In this example, the substrate 202 can be made of semiconductor materials such as silicon. As shown, the semiconductor wafer 200 includes alternatively aligned dielectric layers 206 and electrically conductive layers 208, both being disposed in functional die regions. In addition, vertical pillars 216 and slit trenches 218 can be disposed within and vertically passing through the alternatively aligned dielectric layers 206 and electrically conductive layers 208. At this stage, redistribution layers 220 can be formed above the alternatively aligned stack layers 206 and 208, to provide electrical interconnection between memory cells and control circuits disposed on other regions of the semiconductor wafer 200. The redistribution layers 220 may be embedded in a dielectric layer 222 for electrical isolation. Further, another dielectric layer 224 and a PI layer 226 can be sequentially deposited above the dielectric layer 124 for dielectric isolation. In this example, the alternatively aligned stack layers 206 and 208 are surrounded by grid wall trenches 210. Particularly, the grid wall trenches 210 pass through corresponding alternatively aligned dielectric layers 206 and electrically conductive layers 208, providing isolations from adjacent scribe region 230 on the semiconductor wafer 200.

As shown in FIG. 2, a photo resist layer 228 can be coated above the frontside surface of the semiconductor wafer 200. In addition, the photo resist layer 228 as well as the dielectric layer 222 and the alternatively aligned stack layers 206 and 212 can be patterned in the scribe regions 230 of the semiconductor wafer 200. In this example and incoming to wafer dicing process, the alternatively aligned stack layers of 206 and 212 have been removed from the scribe region 230, clearing an avenue for delivering reaction gases to the interfacial layer 204 and substrate 202. In this example, the functional die regions each has a plurality of fin shape structures 206' protruding along a horizontal direction and toward the scribe region 230. As shown in FIG. 2, the plurality of fin shape structures 206' may be made of a same type of dielectric material to the dielectric layers 206, e.g., silicon oxide. In addition, the plurality of fin shape structures 206' may be connected to sidewalls of corresponding grid wall trenches 210. Moreover, there may be residue materials of the layers 212 disposed between any two adjacent fin shape structure 206'. The residue materials 212 may be made of another type of dielectric material, e.g., silicon nitride. In this example, the plasma dicing process only need to etch through the interfacial layer 204 and into the frontside surface of substrate 202 to form shallow grooves for dice breaking. Here, the etch time of plasma dicing process can be dramatically reduced because materials pending removal by plasma etching are much less compared to that described in traditional semiconductor wafers of FIG. 1.

As shown in FIG. 2, the residue materials 212 may have an uneven surface after the lateral etching. The uneven surface of the etched residue material 212 can be attributed by a micro-loading effect of a non-conformal etching conducted in the scribe region 230. The lateral etching rate may be reduced at a lower location of the scribe region 230, because less etching chemicals may be delivered to the bottom of the scribe region 230. In some examples, the residue materials 212 may have a longer length at a lower location in the scribe region 230 than that at a higher location.

The semiconductor memory wafer dicing process described in FIG. 2 can be used in a 2D NAND device assembly. For example, once individual memory dies are singulated from the semiconductor memory wafer, they can be further arranged in a flat and horizontal substrate to form a 2D architecture of memory cells.

In another example, the semiconductor memory wafer dicing process can be adopted in a 3D NAND memory device assembly. In particular, singulated individual memory dies can be alternatively aligned and stacked on each other in a vertical direction to form a 3D vertical stacking memory architecture. The 3D NAND memory device may offer higher memory storage densities and enlarged storage capacities.

In some other examples, the semiconductor memory wafer dicing process shown in FIG. 2 can be implemented in a 3D DRAM device assembly. For example, scribe regions including alternatively aligned dielectric layers can be formed on a semiconductor wafer having DRAM dies. Individual DRAM dies can be singulated from the wafer and then attached onto each other, e.g., utilizing Through Silicon Vias (TSV). The 3D DRAM device may include volatile memory materials for high speed data storage and retrieval.

Figure 3:
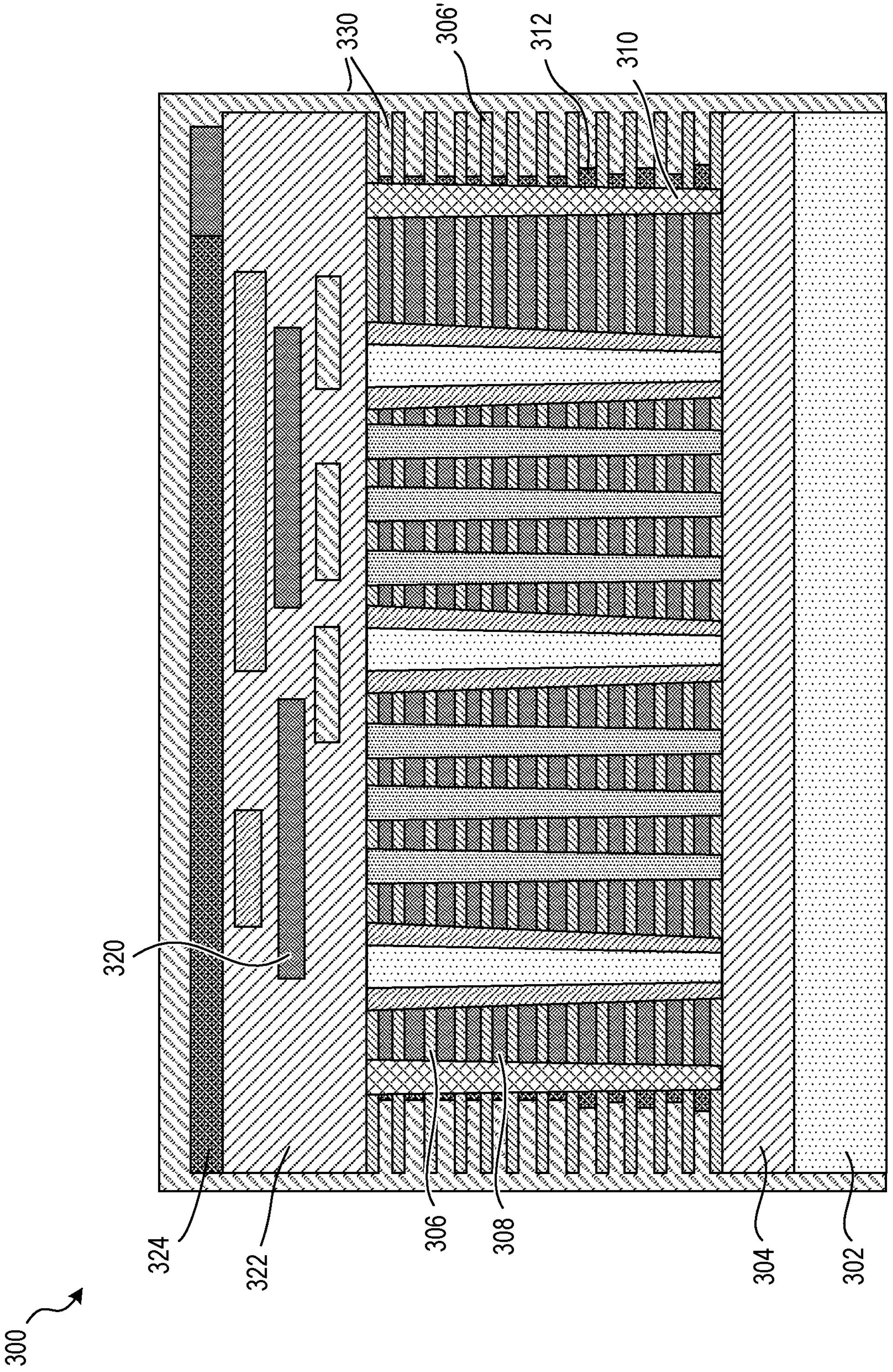
FIG. 3 depicts a schematic view of a semiconductor memory device in accordance with embodiments of the present technology.

FIG. 3 illustrates a schematic view of a semiconductor memory device 300 in accordance with embodiments of the present technology. The semiconductor memory device 300 can be processed by slicing a semiconductor memory wafer into dice and then encapsulating each one of the dice using an encapsulant material 330. In this example, the semiconductor die enclosed in the semiconductor device 300 can be sliced using the plasma dicing technology, e.g., dicing the semiconductor memory wafer 200 along the scribe region 230 as described in FIG. 2.

As shown in FIG. 3, the semiconductor memory device 300 may include a functional die region disposed in a center of the semiconductor memory device 300. The functional die region includes a stack of alternatively aligned dielectric layers 306 and electrically conductive layers 308. The stack layers can be disposed above an interfacial layer 304 that is deposited above a frontside surface of substrate 302. In this example, the dielectric layers 306 can be made of silicon oxide and the electrically conductive layers 308 can be made of tungsten. Each one of the dielectric layers 306 and electrically conductive layers 308 may have a similar thickness ranging from 5 nm to 50 nm. The semiconductor memory device 300 also includes a plurality of pillars 314 and slit trenches 316 vertically passing through the stack of alternatively aligned dielectric layers 306 and electrically conductive layers 308. In this example, the vertical pillars 314 can be made of dielectric materials such as silicon oxide or silicon nitride to provide mechanical support to the memory array included in semiconductor wafer 100. In addition, the slit trenches 316 may have a top opening diameter ranging from 200 nm to 300 nm and may be made of electrically conductive materials (e.g., tungsten or silver), for ground interconnections of circuits embedded in or connected to the semiconductor memory device 300. Moreover, the semiconductor memory device 300 includes a plurality of grid wall trenches 310 that vertically pass through the stack of alternatively aligned dielectric layers 306 and electrically conductive layers 308, providing isolations from functional die region in the center to edge region of the semiconductor memory device 300. Specifically, the plurality of grid wall trenches 310 may be interconnected, along a horizontal direction, to surround corresponding stack of alternatively aligned dielectric layers 306 and electrically conductive layers 308. In this example, the plurality of grid wall trenches 310 can be made of electrically conductive materials including copper, tungsten, molybdenum, nickel, titanium, tantalum, platinum, silver, gold, ruthenium, iridium, rhenium, rhodium, or alloys thereof.

The semiconductor memory device 300 includes a plurality of fin shape structures that are parallelly aligned along the horizontal direction and disposed at the edge of the semiconductor memory device 300. As shown in FIG. 3, the plurality of fin shape structures 306' are portions of the dielectric layers 306 that are extending out of the grid wall trenches 310. Each of the plurality of fin shape structures 306' is connected to outside walls of corresponding grid wall trench 310 and extends toward sidewall of the semiconductor device 300. Each of the plurality of fin shape structure 306' are parallel to each other and are vertically aligned along a thickness direction of the semiconductor device 300. In this example, each of the plurality of fin shape structures 306' may have a thickness similar to the dielectric layers 306 and ranging from 5 nm to 50 nm. Further, each of the plurality of fin shape structure 306' may have one end being perpendicular to corresponding grid wall trench 310. In some examples, there may be dielectric residues disposed between adjacent fin shape structures 306', e.g., silicon nitride residues disposed between adjacent fin shape structures 306' and next to a corresponding grid wall trench 310. As shown in FIG. 3, encapsulant materials, e.g., mold compound 330, can flow into the voids of the plurality of fin shape structures 306', and overflow above the top surface of semiconductor memory die for packaging encapsulation. Here, enhanced adhesion between encapsulant material and the semiconductor memory die can be achieved through increased contact areas between the mold compound 330 and the plurality of fin shape structures 306', in comparison to traditional semiconductor die packaging in which encapsulant materials are only attached on side walls of a semiconductor die.

Figure 4A:
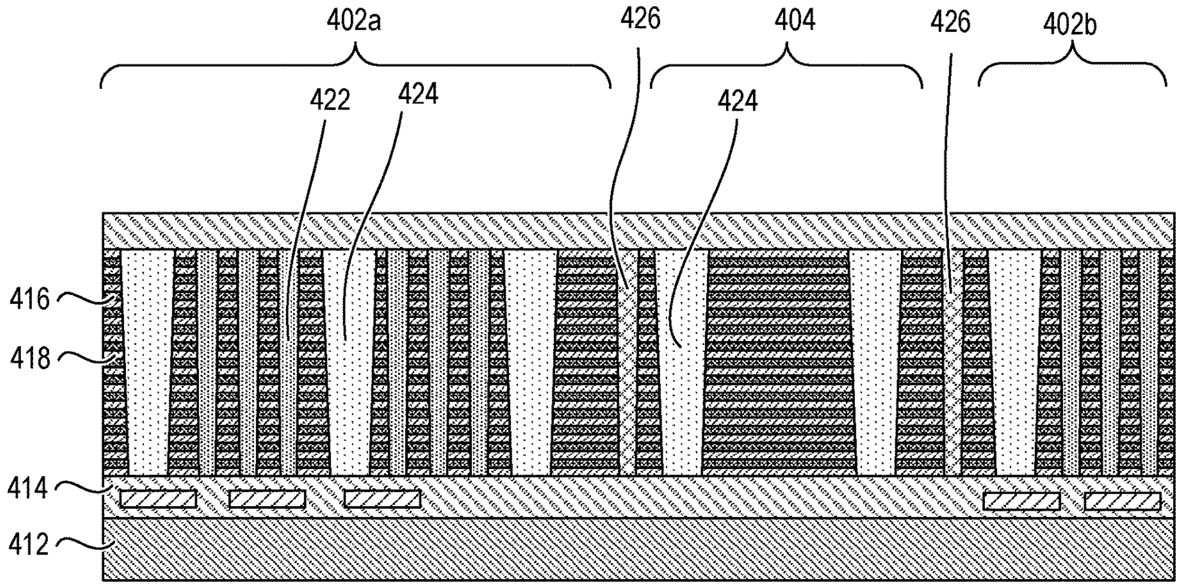
FIGS. 4A-4H depict schematic views of a semiconductor wafer following a process flow of forming semiconductor memory dies in accordance with embodiments of the present technology.

Turning to FIGS. 4A-4H which illustrate cross-sectional schematic views of a semiconductor wafer 400 at various stages of a processing semiconductor memory devices using plasma dicing technology according to embodiments of the present technology. For example, FIG. 4A illustrate the semiconductor wafer 400 having functional die regions and scribe regions prepared thereon. In this example, a plurality of dielectric layers 418 and 416 can be alternatively aligned and deposited above a frontside surface of the substrate 412. Here, the dielectric layer 416 can be silicon nitride and the dielectric layer 418 can be silicon oxide. Each of the plurality of dielectric layers 418 and 416 may have a similar thickness ranging from 5 nm to 50 nm. An interfacial layer 414 can be deposited on the frontside surface of the substrate 412 and may include dielectric materials and poly silicon materials to form source region contact (SRC) nodes under the stack of alternatively aligned dielectric layers 418 and 416. As shown in FIG. 4A, a plurality of vertical pillars 422 and slit trenches 424 can be formed within the alternatively aligned dielectric layers 416 and 418, and across the surface of the semiconductor wafer. Specifically, the vertical pillars may be formed only in functional die regions 402_a_ and 402_b_ and the slit trenches can be formed in both of the functional die regions 402_a_ and 402_b_ and the scribe region 404. In this example, the vertical pillars 422 can be made of dielectric materials such as silicon oxide or silicon nitride to provide mechanical support to the memory array included in semiconductor wafer 400. In addition, the slit trenches 424 may be made of poly silicon. During the preparation of the semiconductor wafer 400, a plurality of grid wall trenches 426 can be formed at the boundaries between the functional die regions (e.g., 402*a* and 402*b*) and the scribe regions (e.g., 404) to provide mechanical isolations. A dielectric layer 417 can be further deposited above the plurality of alternatively stacked dielectric layers 416 and 418 for electrical isolation. In some other examples, each of the interfacial layer 414, and dielectric layers 416, and 418 can be made of materials including tetraethyl orthosilicate (TEOS), silicon oxide (SiO), silicon nitride (SiN), silicon borocarbonitride (SiBCN), silicon oxycarbonitride (SiOCN), silicon oxycarbide (SiOC), silicon carbonitride (SiCN), silicon boronitride (SiBN), a low-k dielectric material, or a combination thereof. Additionally, the plurality of dielectric layers 416 and 418 and interfacial layer 414 can be deposited, for example, using chemical vapor deposition, physical vapor deposition, atomic layer deposition, plating, electroless plating, spin coating, and/or other suitable techniques.

Figure 4B:
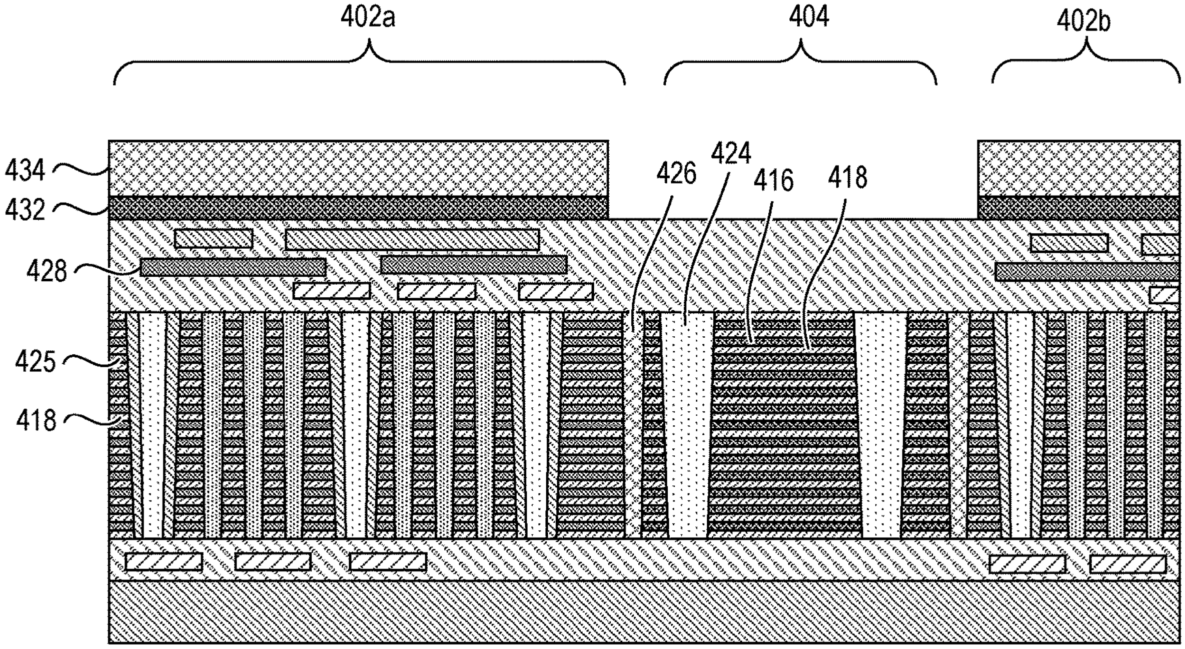

FIG. 4B illustrates RDL layer 428 and PI layer 434 formed above the semiconductor memory wafer 400. Specifically, the RDL layer 428 and PI layer 434 are fabricated after replacing the dielectric layers 416 with electrically conductive layer 425. For example, the semiconductor memory wafer 400 can be coated by a hard mask layer and the hard mask layer can be patterned to expose the functional die regions (e.g., 402*a* and 402*b* as shown in FIG. 4A). An etching process can be further employed to etch through the dielectric layer 417 to further expose top surfaces of the plurality of slit trenches 424. Moreover, a selective poly silicon etching process can be adopted to selectively remove poly silicon from the slit trenches 424 to expose the plurality of dielectric layers 416 along sidewalls of the slit trenches 424. Notably, the slit trenches 424 that are covered by the hard mask layer with maintain its poly silicon trench materials and will not be etched by the selective poly silicon etching process. Thereafter, each of the plurality of dielectric layers 416 can be removed horizontally between adjacent dielectric layers 418. In this example, the dielectric layer 416 can be made of silicon nitride and the dielectric layer 418 can be made of silicon oxide. A silicon nitride etching process, e.g., a fluorine based wets etching process or plasma etching process, can be utilized to selectively remove SiN layers from the stack of SiN/SiO multi layers. Here, etching chemicals and residues can be delivered through sidewalls of the slit trenches 424. Once the dielectric layers 416 are completely removed from the stack layers, an electrically conductive material, e.g., tungsten, can be filled into voids between adjacent dielectric layers 418 to form electrically conductive layers 425. Thereafter, trench materials can be filled into the plurality of trenches, wherein the trench materials can be made of electrically conductive materials, e.g., tungsten or copper. In some examples, a liner layer may be formed in each of the slit trenches to enhance the conductivity and reduce contact resistance.

As shown in FIG. 4B, the RDL layer 428 can be fabricated above the alternatively aligned dielectric layers 418 and conductive layer 426. In some embodiments, the RDL layer 428 may be processed by a damascene interconnect process, a plating process, a spin-on deposition process, and/or a polymer-based deposition process. In addition, the RDL layer 428 may have a thickness ranging from 1 μm to 10 μm and made of aluminum. Further, a passivation layer 432, e.g., a silicon nitride layer, may be formed above the RDL layer 428 to provide electrical isolation. At this stage, the semiconductor memory wafer 400 may also include a PI layer 126 made of polyimide materials deposited by a variety of techniques such as spin coating, spraying, or chemical vapor deposition (CVD). The PI layer 434 are disposed in functional die regions and can serve for electrical isolation and provide mechanical support to the semiconductor memory wafer 400.

Figure 4C:
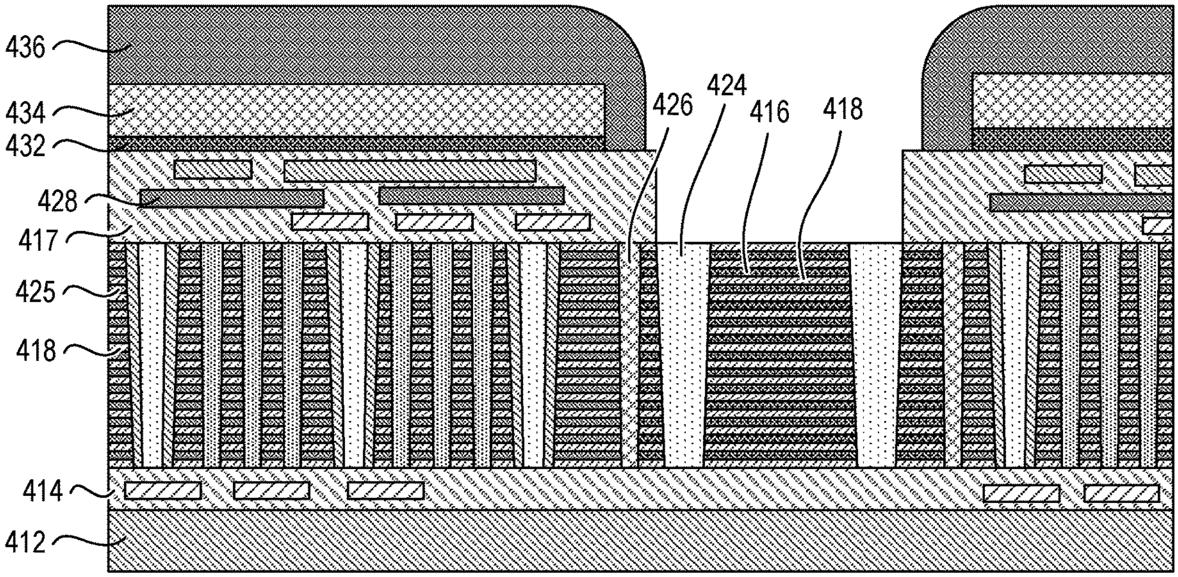

In a next stage, as shown in FIG. 4C, the dielectric layer disposed above the stack of alternatively aligned dielectric layers 416 and 418 can be patterned. Specifically, a photo resist layer 436 can be coated above the semiconductor memory wafer 400. The photo resist layer 436 can be patterned to expose a portion of the dielectric layer 417 disposed in the scribe region 404. An etching process such as a reactive ion etching (RIE) process can be used to etch through the exposed dielectric layer 417 in the scribe region 404 to expose top surfaces of the plurality of slit trench 424 embedded therein.

Figure 4D:
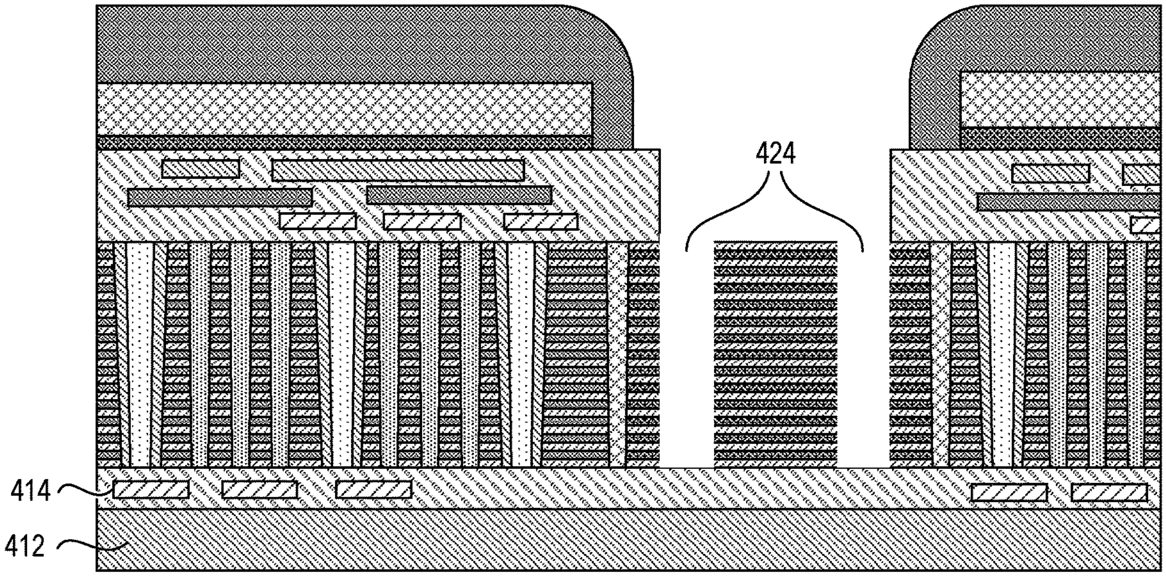

In a next stage, the slit trench material, e.g., poly silicon, can be further removed using a wets etching process from the scribe region 404. In particular, etching chemicals can be delivered to the exposed top surface of the plurality of slit trenches 424 and selectively remove the trench material from the slit trenches 424. In this example, the wets etching process can utilize an etchant solution that selectively etches silicon and leave other materials, e.g., dielectric layers 416 and 418, intact. The choice of etchant solution depends on the desired selectivity and etch rate on silicon and surround materials. For example, a common etchant solution for selectively removing poly silicon in the presence of $SiO_2$ and SiN can be a mixture of hydrofluoric acid (HF) and nitric acid ($HNO_3$). Here, the slit trench etching process can continue until all trench materials have been removed from the slit trenches 424 and the sidewall of slit trenched 424 are fully exposed. As shown in FIG. 4D, the stack of alternatively aligned dielectric layers 416 and 418 are exposed, after the slit trench removal process, on sidewall of the plurality of slit trenches in the scribe region 404.

Figure 4E:
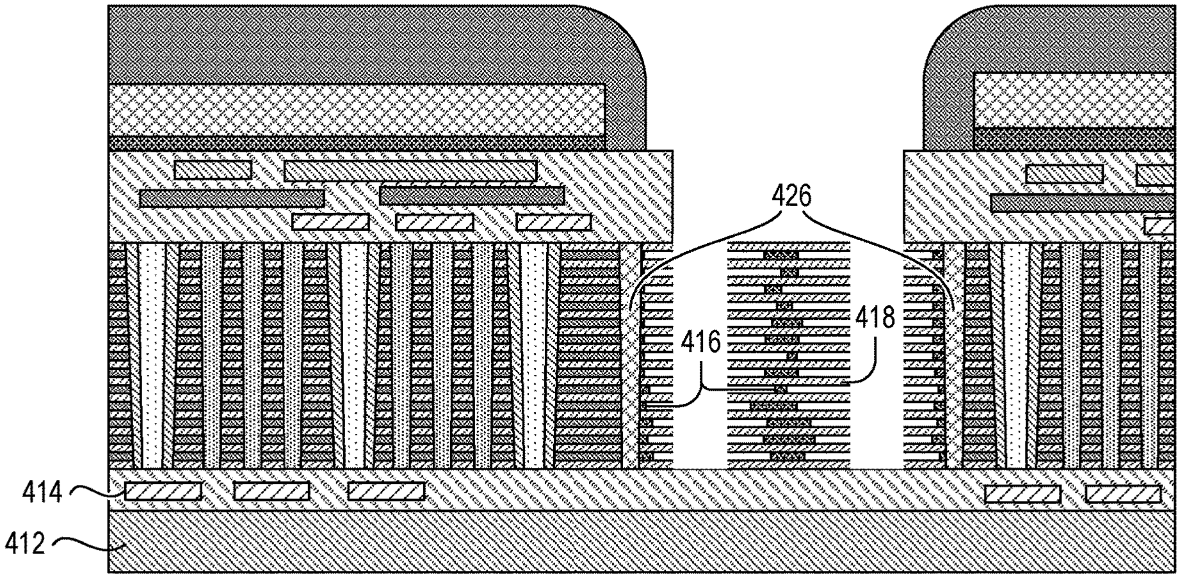

Once the slide trench materials are fully removed from the scribe region 404, as shown in FIG. 4E, a selective etching process can be performed to remove dielectric layers 416 from the stack of dielectric layers 416 and 418. As described earlier, the dielectric layers 416 can be silicon nitride and the dielectric layers 418 can be silicon oxide. In this example, the silicon nitride layers 416 can be removed by a wets etching process or a plasma etching process selective to the silicon oxide layers 418. Specifically, the selective wets etching process can utilize a mixture of phosphoric acid ($H_3PO_4$) and acetic acid ($CH_3COOH$) to horizontally remove the silicon nitride layers sandwiched by adjacent silicon oxide layers 418, without damaging the silicon oxide layers 418. The selective wets etching process may have an etch rate of silicon nitride much higher than the silicon oxide. In another example, a plasma etching process utilizing a mixture of gases, such as $CHF_3$ and $O_2$, can be introduced to generate a plasma and delivery the plasma to the SiN layers 416 and $SiO_2$ layers 418. The reactive species in the plasma can selectively etch the SiN layers 416 without removing the $SiO_2$ layers 418.

Figure 4F:
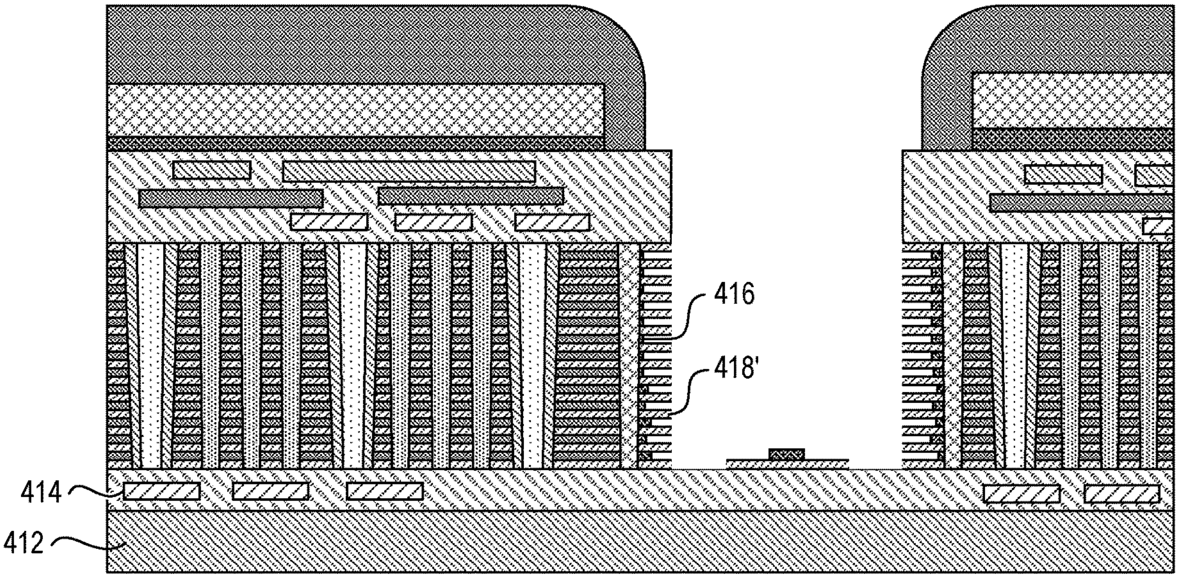

As shown in FIG. 4F, the selective etching process continues until the dielectric layers 416, e.g., the silicon nitride layer, are completed removed from the stack of dielectric layers 416 and 418 in the scribe region 404. In some examples, a deionized (DI) water rinse process may be followed to dissolve and remove residues (e.g., removed silicon nitride and collapsed silicon oxide layers in the scribe regions 404) from the semiconductor memory wafer 400. At this stage, the dielectric layers 418 present a fin shape structure 418' at the edge of functional die regions 402*a* and 402*b*. In this example, each of the fin shape structures 418' may have a thickness ranging from 5 nm to 50 nm and a length up to 1 μm. Specifically, each of the fin shape structures 418' may have one end connected to the grid wall trenches 426. In some examples, residues of the dielectric layers 416 (e.g., silicon nitride) may exist among parallelly aligned fin shape structures 418', as shown in FIG. 4F. The void spaces disposed between adjacent fin shape structure 418' may have various aspect ratios, e.g., ranging from 5:1 to 50:1. Here, the aspect ratio of void spaces may be adjusted by changing the thickness of the each of the plurality of dielectric layer 416. Further, the aspect ratio of void spaces can also be adjusted by changing a distance between a slid trench 424 to its neighboring grid wall trench 426. Here, the thickness of dielectric layer 416 may define the width of each of the void spaces and the distance may define the depth of each of the void spaces. A lower aspect ratio of the void space between adjacent fin shape structures 418' may offer an easy avenue for down stream process, e.g., the molding material encapsulating process described later in this disclosure.

Figure 4G:
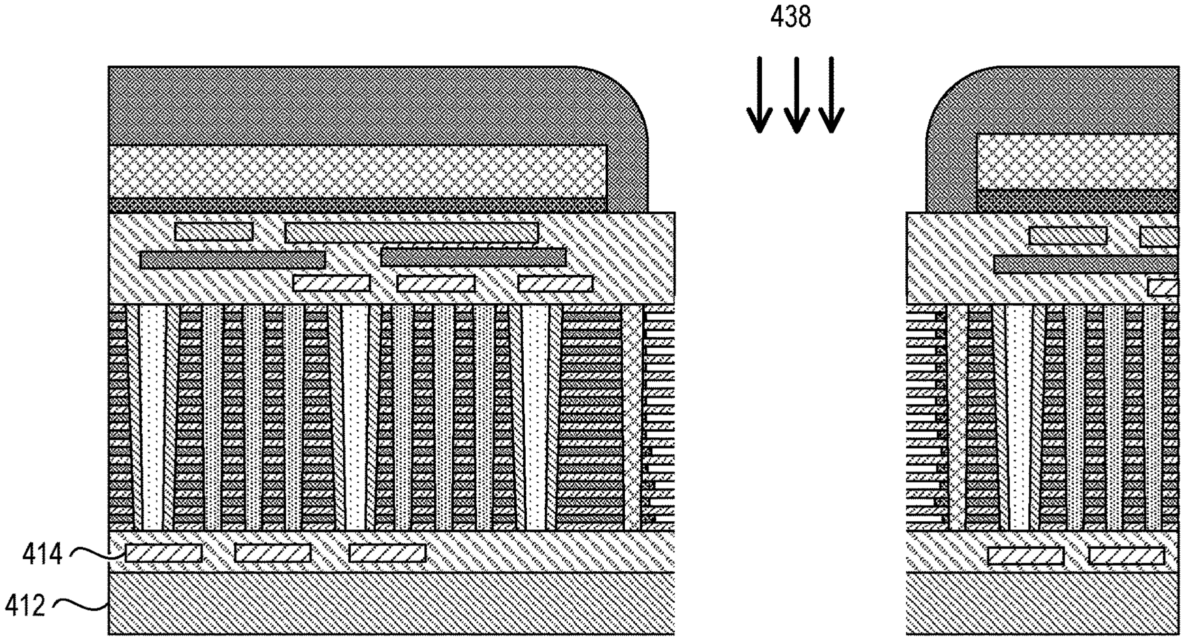

Once the stack of dielectric layers (e.g., layers 416 and 418) are removed from the scribe region 404 of the semiconductor memory wafer 400, a plasma dicing process 438 can be introduced to etch through the interfacial layer 414 and substrate 412 along the scribe region 404. In some other examples, a directional etching process such as a RIE process can be firstly introduced to break through the interfacial 414 layer, and then the plasma dicing process 438 can be started to etch grooves on the substrate 412. Because in general the plasma dicing process 438 can have a much higher etch rate on silicon substrate than dielectric materials, the throughput of the substrate dicing process in this example can be largely improved compared to the traditional dicing process described in FIG. 1. The plasma dicing process 438 may be continued until the substrate 412 of the semiconductor memory wafer 400 is diced into individual dice. Depending on the locations of slit trenches 424 in the scribe region 404, the plurality of fin shape structure may have one end vertically aligned to corresponding edges of the substrate 412, as shown in FIG. 4G.

Figure 4H:
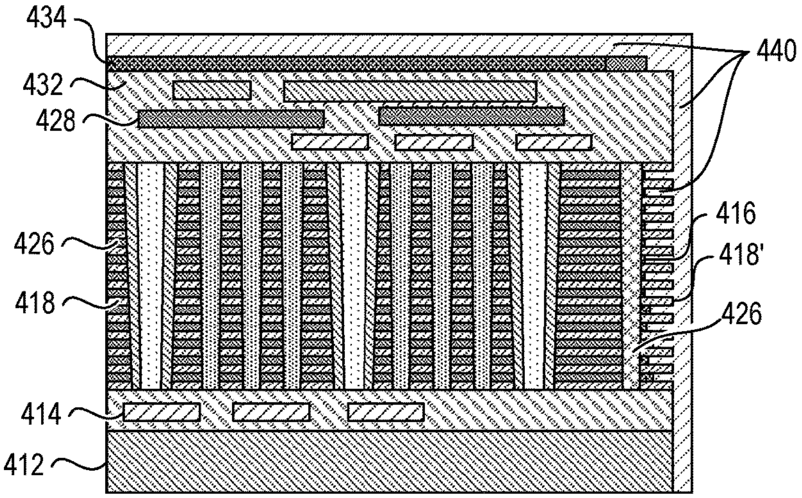

As shown in FIG. 4H, encapsulant materials can be further applied on each one of the semiconductor memory dice to complete the packaging. In this example, encapsulant materials 440, e.g., a mold compound, can flow into the voids of the plurality of fin shape structures 418', and overflow above the top surface of semiconductor memory die for packaging encapsulation. Here, enhanced adhesion between encapsulant material and the semiconductor memory die can be achieved through the increased contact areas between the mold compound 440 and the plurality of fin shape structures 418', in comparison to traditional semiconductor die packaging process in which encapsulant materials are barely attached on side walls of a semiconductor die. The enhanced adhesion in this example can help reduce or prevent delamination defects in semiconductor device packaging. Here, the encapsulant materials 440 can be made of molding compound including at least one of an epoxy-based liquid compound with granules, an epoxy-based liquid compound without granules, a granular compound, a thin-film based underfill, a thin-film based compound, a resin-based encapsulant, or a polymer.

Figure 5:
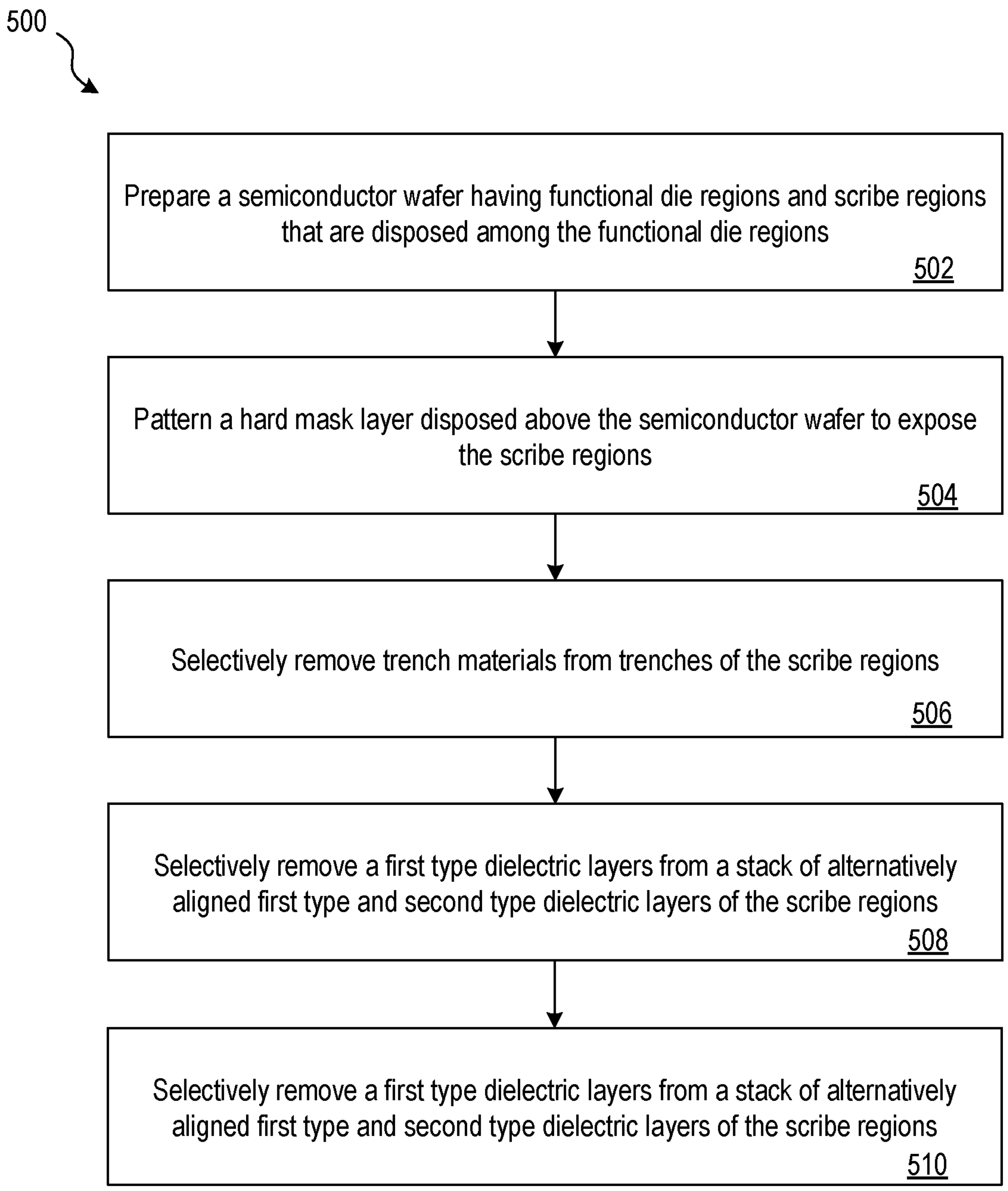
FIG. 5 is a flow chart illustrating a method of processing a semiconductor memory device according to embodiments of the present technology.

Turning to FIG. 5 which is a flow chart illustrating a method 500 of processing a semiconductor memory device according to embodiments of the present technology. The method 500 includes preparing a semiconductor wafer having functional die regions and scribe regions that are disposed among the functional die regions, at 502. For example, the semiconductor memory wafer 400 can be processed to form functional die regions 402*a*, 402*b*, and scribe regions 404, as shown in FIG. 4A.

In addition, the method 500 includes patterning a hard mask layer disposed above the semiconductor wafer to expose the scribe regions, at 504. For example, the photo resist layer 436 can be coated above the semiconductor memory wafer 400. Further, a patterning process can be conducted above the photo resist layer 436 to expose the portion of the dielectric layer 417 disposed in the scribe region 404, as shown in FIG. 4C.

The method 500 also includes selectively removing trench materials from trenches of the scribe regions, at 506. For example, the poly silicon can be selectively removed from slit trenches 424 that are disposed in the scribe region 404, as shown in FIG. 4D. The selective etching can be conducted by using an etchant solution of hydrofluoric acid (HF) and nitric acid ($HNO_3$), to remove poly silicon in the slit trenches 424 in the presence of dielectric layers 416 and 418.

Furthermore, the method 500 includes selectively removing a first type dielectric layers from a stack of alternatively aligned first type and second type dielectric layers of the scribe regions, at 508. For example, the silicon nitride layers 416 sandwiched by adjacent silicon oxide layers 418 in the stack of dielectric layers of the scribe region 404 can be selectively removed. As described in FIG. 4F, the selective etching may continue until the dielectric layers 416 are all removed and the dielectric layers 418 are all collapsed in the scribe region 404. A selective wets etching technique or a selective plasma etching technique can be used for this process. In this example, the selectively etching process forms a plurality of fin shape structures 418' parallelly aligned and connected to the grid wall trenches 426.

Figure 6:
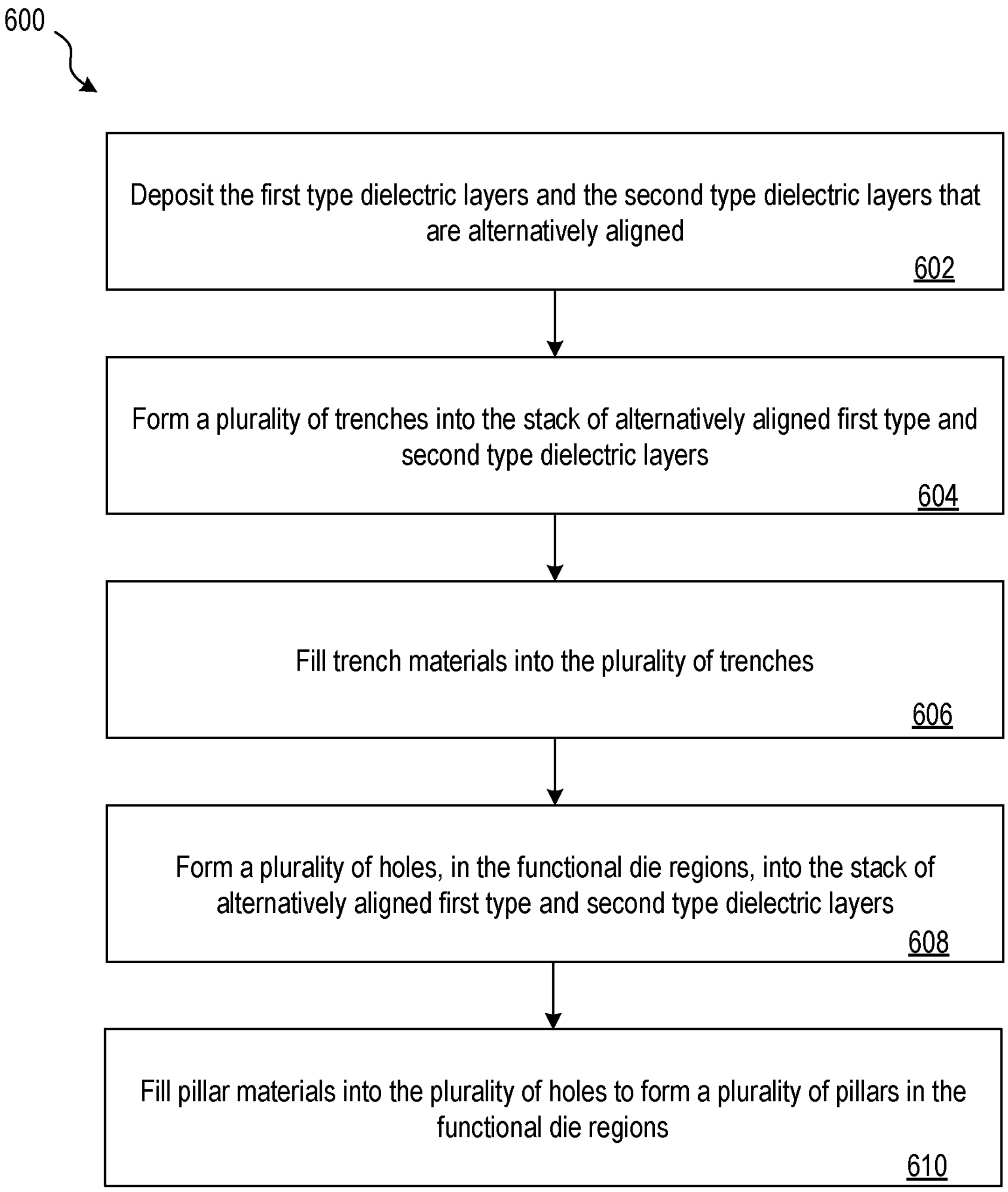
FIG. 6 is a flow chart illustrating a method of preparing a semiconductor wafer for plasma dicing of semiconductor wafer into semiconductor dies according to embodiments of the present technology.

Lastly, the method 500 includes dicing the semiconductor wafer into semiconductor dies along the scribe regions, at 510. For example, once the stack of dielectric layers 416 and 418 are removed in the scribe region 404, a plasma dicing process can be conducted along the scribe region 404 to etch through the interfacial layer 414 and cut the substrate 412 into individual semiconductor dice, as described in FIG. 4G. Moreover, encapsulant materials can be applies, e.g., flow into voids among the plurality of fin shape structures 418' and on the sidewalls of individual semiconductor dies to complete the packaging FIG. 6 is a flow chart illustrating another method 600 of preparing a semiconductor wafer for plasma dicing of semiconductor wafer into semiconductor dice according to embodiments of the present technology. The method 600 includes depositing the first type dielectric layers and the second type dielectric layers that are alternatively aligned, at 602. For example, the dielectric layers 416 and dielectric layers 418 can be alternatively deposited on each other on the semiconductor memory wafer 400. The dielectric layers 416 can be silico nitride and the dielectric layers 418 can be silicon oxide.

The method 600 also includes forming a plurality of trenches into the stack of alternatively aligned first type and second type dielectric layers, at 604. For example, slit trenches 424 can be patterned through the stack of dielectric layers 416 and dielectric layers 418, as shown in FIG. 4A.

Specifically, the slit trenches 424 can be formed in the functional die regions 402 and scribe regions 404.

In addition, the method 600 includes filling trench materials into the plurality of trenches, at 606. For example, poly silicon can be deposited into the slit trenches 424. The deposition of poly silicon can be conducted using chemical vapor deposition, physical vapor deposition, atomic layer deposition, plating, electroless plating, spin coating, and/or other suitable techniques.

Moreover, the method 600 includes forming a plurality of holes, in the functional die regions, into the stack of alternatively aligned first type and second type dielectric layers, at 608. For example, the plurality of holes can be etched through the stack of dielectric layers 416 and dielectric layers 418, as shown in FIG. 4A. A hard mask layer may be patterned above the stack of dielectric layers. A directional etching process can be utilized to etch the plurality of holes through the patterned hard mask. Notably, the plurality of holes can only be formed in the functional die regions 402*a* and 402*b* of the semiconductor memory wafer 400.

Lastly, the method 600 includes filling pillar materials into the plurality of holes to form a plurality of pillars in the functional die regions, at 610. For example, dielectric materials such as silicon oxide or silicon oxynitride can be filled into the plurality of holes to form the plurality of pillars 422 to provide mechanical support to the memory array included in semiconductor memory wafer 400. As shown in FIG. 4A, the plurality of pillars 422 are only disposed within the functional die regions 402*a* and 402*b*.

Figure 7:
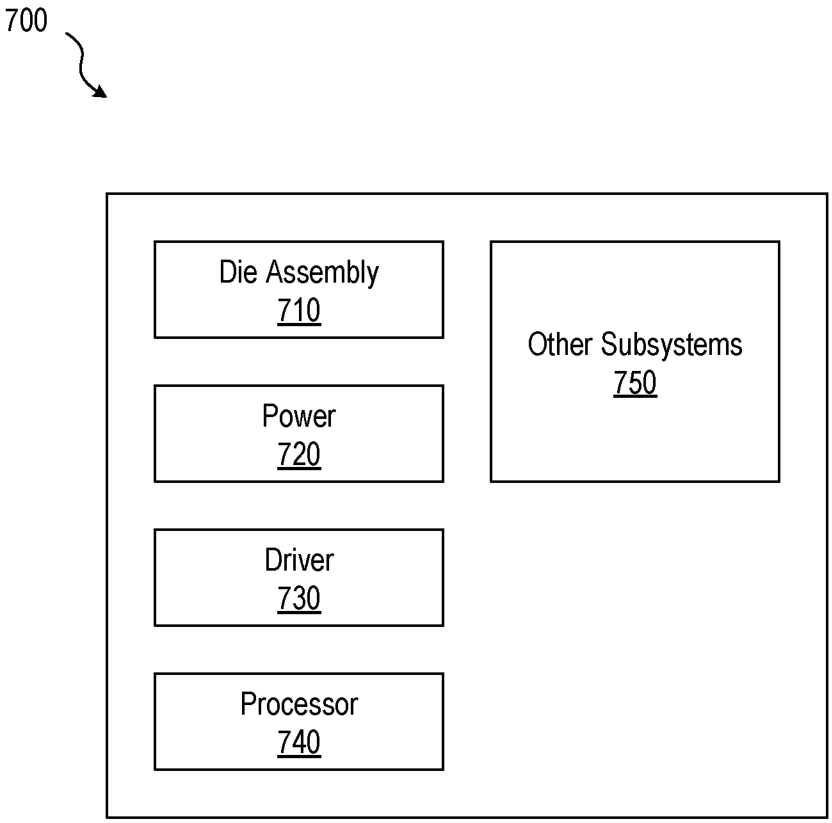
FIG. 7 is a schematic view of a system that includes a semiconductor device configured according to embodiments of the presented technology.

Any one of the semiconductor structures described above with reference to FIGS. 2-6 can be incorporated into any of a myriad of larger and/or more complex systems, a representative example of which is system 700 shown schematically in FIG. 7. The system 700 can include a semiconductor device 710, a power source 720, a driver 730, a processor 740, and/or other subsystems or components 750. The semiconductor device 710 can include features generally similar to those of the semiconductor devices described above and can therefore include the selective silicon nitride removal process for plasma dicing of the semiconductor wafer described in the present technology. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, and appliances. Components of the system 700 may be housed in a single unit or distributed over multiple, interconnected units (e.g., through a communications network). The components of the system 700 can also include remote devices and any of a wide variety of computer-readable media.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random access memory (DRAM) dice, NOT-AND (NAND) memory dice, NOT-OR (NOR) memory dice, magnetic random access memory (MRAM) dice, phase change memory (PCM) dice, ferroelectric random access memory (FeRAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device, comprising:

a semiconductor die, including:

a substrate, a functional die region disposed in a center of the semiconductor die, the functional die region having a stack layer structure within which a plurality of dielectric layers and a plurality of electrically conductive layers alternatively stacked, and a die edge region disposed at edges of the semiconductor die, the die edge region including a plurality of fin shape structures protruding along a horizontal direction to a sidewall of the semiconductor device; and an encapsulant material disposed at the edges of the semiconductor die and among the plurality of fin shape structures.

2. The semiconductor device of claim 1, wherein the plurality of fin shape structures are parallel to each other and are vertically aligned along a thickness direction of the semiconductor die.

3. The semiconductor device of claim 2, wherein each of the plurality of fin shape structures has a thickness along a vertical direction ranging from 5 nm to 50 nm.

4. The semiconductor device of claim 2, further comprising grid wall trenches that are disposed at edges of the stack layer structure and that surround the functional die region.

5. The semiconductor device of claim 4, wherein the plurality of fin shape structures each has a first end connected to corresponding outside walls of the grid wall trenches, each of the plurality of fin shape structures being perpendicular to corresponding grid wall trenches.

6. The semiconductor device of claim 5, wherein the grid wall trenches are made of conductive materials including copper, tungsten, molybdenum, nickel, titanium, tantalum, platinum, silver, gold, ruthenium, iridium, rhenium, rhodium, or alloys thereof.

7. The semiconductor device of claim 5, further comprising dielectric residues disposed between adjacent fins of the plurality of fin shape structures, the dielectric residues being connected to the outside walls of the grid wall trenches.

8. The semiconductor device of claim 5, wherein each of the plurality of fin shape structures has a second end that are vertically aligned to corresponding edge of the substrate.

9. The semiconductor device of claim 2, wherein the plurality of fin shape structures are made of dielectric materials including tetraethyl orthosilicate (TEOS), silicon oxide (SiO), silicon nitride (SiN), silicon borocarbonitride (SiBCN), silison oxycarbonitride (SiOCN), silicon oxycarbide (SiOC), silicon carbonitride (SiCN), silicon boronitride (SiBN), a low-k dielectric material, or a combination thereof.

10. The semiconductor device of claim 2, wherein the encapsulant material is a molding compound including at least one of an epoxy-based liquid compound with granules, an epoxy-based liquid compound without granules, a granular compound, a thin-film based underfill, a thin-film based compound, a resin-based encapsulant, or a polymer.

11. A semiconductor device, comprising:

a semiconductor die, the semiconductor die including a plurality of dielectric layers that are disposed at edge regions of the semiconductor die; and an encapsulant material that is disposed among the plurality of dielectric layers and that surrounds the semiconductor die, wherein each of the plurality of dielectric layers are vertically aligned and extending along a horizontal plane.

12. The semiconductor device of claim 11, further comprising:

a functional die region disposed in a center of the semiconductor device; and grid wall trenches that are vertically disposed at edges of the functional die region and that surrounds the functional die region, wherein the plurality of dielectric layers each has an inner end connected to corresponding grid wall trenches, and the plurality of dielectric layers are perpendicular to corresponding grid wall trenches.

13. A method of forming a semiconductor device, comprising:

preparing a semiconductor wafer having functional die regions and scribe regions that are disposed among the functional die regions;

patterning a hard mask layer disposed above the semiconductor wafer to expose the scribe regions;

selectively removing trench materials from trenches of the scribe regions;

selectively removing a first type dielectric layers from a stack of alternatively aligned first type and second type dielectric layers of the scribe regions; and dicing the semiconductor wafer into semiconductor dice along the scribe regions.

14. The method of claim 13, wherein preparing the semiconductor wafer comprises:

depositing the first type dielectric layers and the second type dielectric layers that are alternatively aligned, forming a plurality of trenches into the stack of alternatively aligned first type and second type dielectric layers, filling trench materials into the plurality of trenches, forming a plurality of holes, in the functional die regions, into the stack of alternatively aligned first type and second type dielectric layers, and filling pillar materials into the plurality of holes to form a plurality of pillars in the functional die regions.

15. The method of claim 14, wherein preparing the semiconductor wafer further comprises:

forming grid wall trenches at boundaries between the functional die regions and corresponding scribe regions, and filling grid wall materials into the grid wall trenches at the boundaries to form grid walls, wherein the grid wall trenches are disposed at edges of and surround the functional die regions.

16. The method of claim 14, wherein preparing the semiconductor wafer further comprises:

patterning another hard mask layer above the semiconductor wafer to expose the functional die regions, selectively removing the trench materials from the plurality of trenches, selectively removing the first type dielectric layers, through sidewalls of the plurality of trenches, from the functional die regions, filling a third type conductive material into the functional die regions, the third type conductive material forming a third type conductive layers each disposed between adjacent second type dielectric layers, and filling a fourth type conductive material into the plurality of trenches.

17. The method of claim 13, further comprising forming, after preparing the semiconductor wafer, a plurality of dielectric isolation layers and redistribution layers above the semiconductor wafer.

18. The method of claim 17, further comprising patterning the plurality of dielectric isolation layers and redistribution layers to expose the scribe regions.

19. The method of claim 18, wherein selectively removing the first type dielectric layers of the scribe regions comprises selectively etching the first type dielectric layers from sidewall of the trenches of the scribe regions, wherein the selectively removing of the first type dielectric layers in the scribe regions extends to a center region of each of the scribe regions and corresponding functional die regions, and wherein the second type dielectric layers are removed from the scribe regions after the first type dielectric layers in the scribe regions are removed.

20. The method of claim 13, wherein dicing the semiconductor wafer into semiconductor dice along the scribe regions is conducted by a plasma dicing process.

* * * * *